(12) United States Patent
Kwon et al.

(10) Patent No.: US 7,327,020 B2
(45) Date of Patent: Feb. 5, 2008

(54) MULTI-CHIP PACKAGE INCLUDING AT LEAST ONE SEMICONDUCTOR DEVICE ENCLOSED THEREIN

(75) Inventors: Heung-Kyu Kwon, Seongnam-si (KR); Hee-Seok Lee, Hwaseong-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 1 day.

(21) Appl. No.: 11/033,997

(22) Filed: Jan. 13, 2005

(65) Prior Publication Data

US 2005/0194673 A1 Sep. 8, 2005

(30) Foreign Application Priority Data

| Jan. 13, 2004 | (KR) | ...................... 10-2004-0002369 |
| Jun. 3, 2004 | (KR) | ...................... 10-2004-0040420 |

(51) Int. Cl.
    H01L 23/02 (2006.01)
(52) U.S. Cl. .................. 257/686; 257/723; 257/777; 257/730
(58) Field of Classification Search ........... 257/686, 257/777, 685, 723, 730
    See application file for complete search history.

(56) References Cited

U.S. PATENT DOCUMENTS 6,737,738 B2 * 5/2004 Koh et al. ................. 257/686

| 2002/0113323 A1 | 8/2002 | Nakanishi et al. |
| 2003/0038374 A1 | 2/2003 | Shim et al. |
| 2003/0042590 A1 | 3/2003 | Goller et al. |
| 2003/0207516 A1 | 11/2003 | Tan et al. |
| 2004/0000723 A1 | 1/2004 | Egawa |

FOREIGN PATENT DOCUMENTS

| DE | 10209204 | 10/2003 |
| JP | 204-031754 | 1/2004 |
| KR | 2001-0055041 A | 7/2001 |
| KR | 2003-0007098 A | 1/2003 |

* cited by examiner

Primary Examiner—Monica Lewis
(74) Attorney, Agent, or Firm—Harness, Dickey & Pierce, P.L.C.

(57) ABSTRACT

A multi-chip package, a semiconductor device used therein, and manufacturing method thereof are provided. The multi-chip package may include a substrate having a plurality of substrate bonding pads formed on an upper surface thereof, at least one first semiconductor chip mounted on the substrate, and at least one second semiconductor chip mounted on the substrate where the at least one first semiconductor chip may be mounted. The at least one second semiconductor chip may include at least one three-dimensional space so as to allow the at least one first semiconductor chip to be enclosed within the at least one three-dimensional space. The at least one three-dimensional space may be a cavity, a groove, or a combination thereof.

6 Claims, 13 Drawing Sheets

MULTI-CHIP PACKAGE INCLUDING AT LEAST ONE SEMICONDUCTOR DEVICE ENCLOSED THEREIN

This U.S. non-provisional application claims priority under 35 U.S.C. § 119 to Korean Patent Application Nos. 10-2004-0002369 and 10-2004-0040420 filed on Jan. 13, 2004 and Jun. 3, 2004, respectively, in the Korean Intellectual Property Office, the contents of which are incorporated herein by reference in their entirety.

BACKGROUND OF THE INVENTION

1. Field of the Invention

Exemplary embodiments of the present invention relate generally to a multi-chip package, a semiconductor device used therein, and manufacturing method thereof.

2. Description of the Related Art

In recent years, with the rapidly increasing demand for portable electronic products, the demand for thin, small and/or lightweight elements mounted in the portable electronic products has increased.

Conventionally, there may be ways to attain the thin, small and/or lightweight elements, including, for example, shrinking the physical size of a discrete element, integrating multiple individual elements into a single chip (e.g., a system-on-a-chip (SOC) technique), and/or integrating multiple individual elements into a single package (e.g., a system-in-package (SIP) technique).

Further, the SIP technique may be similar to another conventional technique called multi-chip module (MCM), in which multiple silicon chips may be horizontally or vertically mounted in a single package. Thus, according to the conventional MCM technique, the multiple chips may be mounted generally in a horizontal direction, whereas in the SIP technique, the chips may be generally mounted in a vertical direction.

Further, if a radio frequency (RF) chip, which may be smaller than a logic/memory chip stacked on a large-sized chip, is employed, the length of connectors, such as bonding wires of the RF chip may need to be longer. This may reduce performance of the RF chip and may generate a crosstalk between the RF chip and the large-sized chip.

Thus, when stacking a plurality of chips in a perpendicular direction, the RF chip may generally be placed at the bottom of the stack.

In a case where the size of an upper semiconductor chip may be larger than that of a lower semiconductor chip, or when two rectangular semiconductor chips having relatively the same size and area may be stacked in a crosswise manner, then the wire-bonding chip pads located in a hangover portion (e.g., a portion of the upper chip which is not supported by the lower chip) of the upper semiconductor chip may develop defective cracks, for example, due to the contact impact of a bonding capillary and/or during a wire-bonding process.

SUMMARY OF THE INVENTION

In an exemplary embodiment of the present invention, a multi-chip package may include a substrate including a plurality of substrate bonding pads formed on an upper surface thereof, at least one first semiconductor chip mounted on the substrate, and at least one second semiconductor chip mounted on the substrate where the at least one first semiconductor chip may be mounted. The at least one second semiconductor chip may have at least one three-dimensional space on a lower surface thereof so as to allow the at least one first semiconductor chip to be enclosed within the at least one three-dimensional space.

In another exemplary embodiment, the at least one three-dimensional space may be a cavity, a groove, or a combination thereof formed through the lower surface of the at least one second semiconductor chip.

In another exemplary embodiment, the at least one first and the at least one second semiconductor chips may be connected to the substrate bonding pads by at least one of a wire-bonding process and a flip-chip bonding process.

In another exemplary embodiment, the at least one first semiconductor chip may be attached to the substrate by a conductive adhesive, and the at least one first semiconductor chip, mounting portions and bonding portions of the mounting portions may be encapsulated within the at least one three-dimensional space.

In another exemplary embodiment, the at least one the first semiconductor chip may be attached to the substrate by an insulating adhesive, and the at least one first semiconductor chip, mounting portions and bonding portions of the mounting portions may either be encapsulated or exposed within the at least one three-dimensional spaces.

In another exemplary embodiment, the at least one second semiconductor chip, mounting portions and bonding portions of the mounting portions may be encapsulated by a package body.

In another exemplary embodiment, the substrate may be at least one of a molded lead frame, a printed circuit board, direct bond copper (DBC), a flexible film, and an interposer.

In another exemplary embodiment, the at least one first semiconductor chip may be a radio frequency (RF) chip and the at least one second semiconductor chip may be a chip for a memory or a logic circuit.

In an exemplary embodiment of the present invention, a multi-chip package may include a substrate in which a plurality of substrate bonding pads may be formed on an upper surface thereof, at least one first semiconductor chip mounted on the substrate, at least one passive device mounted on the substrate, and at least one second semiconductor chip mounted on the substrate where the at least one first semiconductor chip and the at least one passive device may be mounted. The at least one second semiconductor chip may have at least one three-dimensional space on a lower surface thereof so as to allow the at least one first semiconductor chip and the at least one passive device to be enclosed within the at least one three-dimensional space.

In an exemplary embodiment of the present invention, a multi-chip package may include at least a substrate in which a plurality of substrate bonding pads may be formed on an upper surface and a lower surface thereof, at least one first semiconductor chip mounted on the upper surface of the substrate, at least one second semiconductor chip mounted on the lower surface of the substrate, at least one third semiconductor chip mounted on the upper surface of the substrate, and at least one fourth semiconductor chip mounted on the lower surface of the substrate. The at least one third semiconductor chip may have at least one three-dimensional space on a non-active surface thereof so as to allow the at least one first semiconductor chip to be enclosed within the at least one three-dimensional space. The at least one fourth semiconductor chip may have at least one three-dimensional space on a non-active surface thereof so as to allow the at least one second semiconductor chip to be enclosed within the at least one three-dimensional space.

In another exemplary embodiment, the at least one three-dimensional space in the at least one third semiconductor chip and the at least one fourth semiconductor chip may be a cavity, a groove, or a combination thereof formed through the non-active surface of the at least one third and fourth semiconductor chips.

In another exemplary embodiment, the at least one first, second, third and fourth semiconductor chips may be connected to the substrate bonding pads by at least one of a wire-bonding process and a flip-chip bonding process.

In another exemplary embodiment, the at least one second semiconductor chip and the at least one fourth semiconductor chip, mounting portions and bonding portions of the mounting portions may be encapsulated.

In another exemplary embodiment, the at least one first semiconductor chip and the at least one third semiconductor chip, mounting portions and bonding portions of the mounting portions may be encapsulated.

In an exemplary embodiment of the present invention, a semiconductor device used in a multi-chip package may include a substrate having an active surface and a non-active surface which may be the other side of the active surface, and chip pads mounted on the active surface of the substrate, wherein at least one three-dimensional space may be formed on the active surface or the non-active surface of the substrate.

In an exemplary embodiment of the present invention, a multi-chip package may include at least a substrate in which a plurality of substrate bonding pads may be formed on an active surface and a non-active surface thereof, and at least two semiconductor chips mounted on the substrate, wherein one of the least two semiconductor chips may include at least one three-dimensional space to enclose the another semiconductor chip within the at least one three-dimensional space.

In an exemplary embodiment of the present invention, a method of manufacturing a multi-chip package is disclosed. The method may include at least mounting a plurality of substrate bonding pads on an upper surface of a substrate, mounting at least one first semiconductor chip on the substrate, and mounting at least one second semiconductor chip on the substrate, wherein the at least one second semiconductor chip may include at least one three-dimensional space on a surface thereof so as to allow the at least one first semiconductor chip to be enclosed within the at least one three-dimensional space.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENTS

Figure 1:
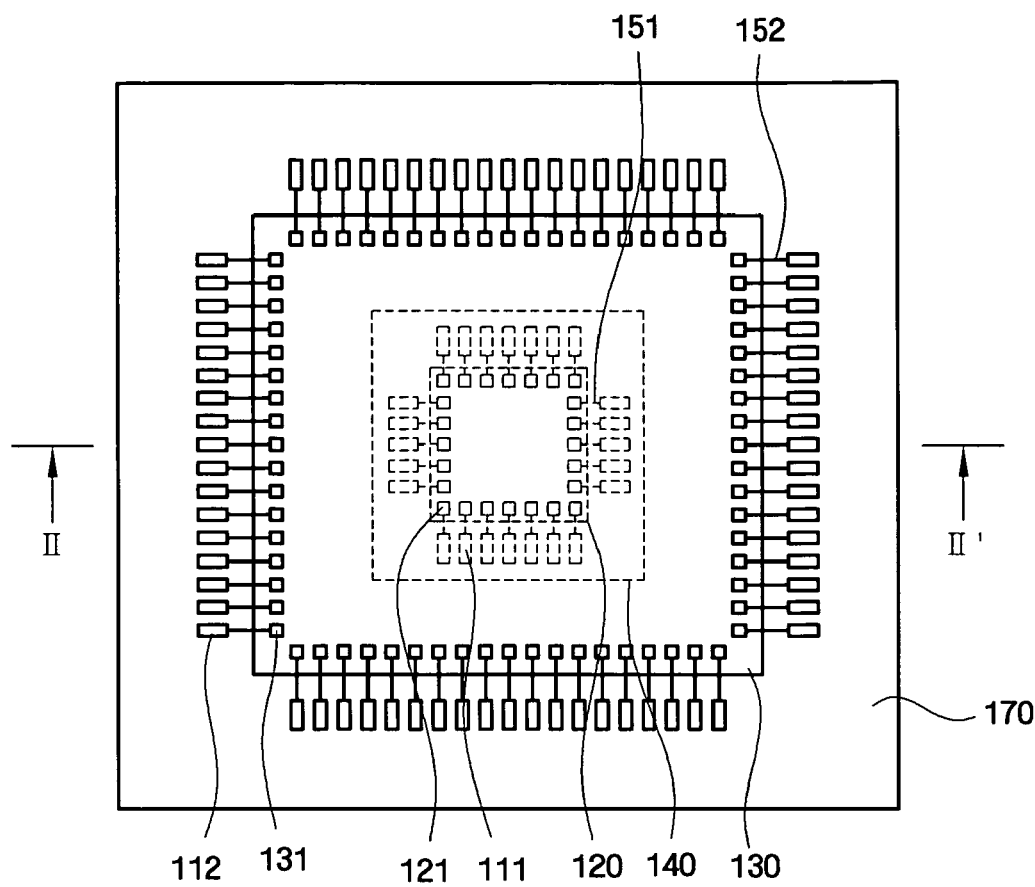
FIG. 1 is a plan view illustrating an exemplary embodiment of a multi-chip package according to the present invention.

Exemplary embodiments may be understood more readily by reference to the following detailed description of exemplary embodiments and the accompanying drawings. The present invention may, however, be embodied in many different forms and should not be construed as being limited to the embodiments set forth herein. Rather, these exemplary embodiments are provided so that this disclosure will be thorough and complete and will fully convey the concept of the invention to those skilled in the art. Like reference numerals refer to like elements throughout the specification.

It should also be noted that the figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or semiconductor chips may be reduced or exaggerated for clarity. Further, the semiconductor chip is considered as being formed "on" another layer or a substrate when formed either directly on the referenced layer or the substrate or formed on other layers or patterns overlaying the referenced layer. It will further be understood that when a semiconductor chip is referred to as being "on" or "formed over" another layer or substrate, the semiconductor chip may be directly on the other layer or substrate, or intervening layer(s) may also be present.

Figure 2:
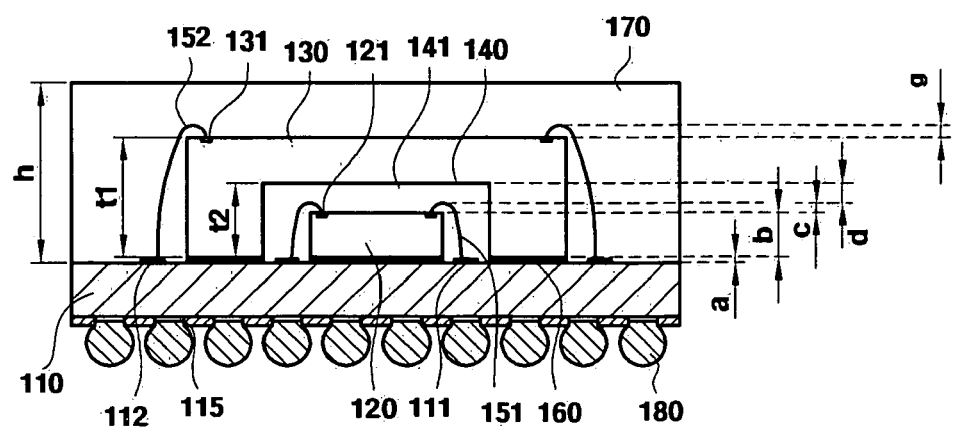
FIG. 2 is a cross-sectional view taken along a line II-II' of FIG. 1.

A multi-chip package according to an exemplary embodiment of the present invention is described in reference to FIGS. 1 and 2.

FIG. 1 is a plan view illustrating an exemplary embodiment of a multi-chip package according to the present invention, and FIG. 2 is a cross-sectional view taken along a line II-II' of FIG. 1.

In the multi-chip package according to an exemplary embodiment of the present invention, as shown in FIGS. 1 and 2, a reduced-sized first chip 120 may be attached on a substrate 110. The substrate 110 may include a plurality of substrate bonding pads 111 and 112 formed on its upper surface and a plurality of terminals 115 formed on its lower surface.

The substrate 110 may be, for example, a molded lead frame, a printed circuit board, a direct bond copper (DBC), a flexible film, or the like. The DBC may be referred to as a substrate in which copper layers may be attached to both surfaces of an insulating ceramic substrate, respectively.

Further, an interposer providing electrical connection and/or mechanical flexibility between a semiconductor chip and an assembly (PC) substrate may also be used as the substrate 110.

The interposer may be made of an elastic material such as, but not limited to, a tape, a polyimide, and/or a plastic material. The interposer may further include a single or a plurality of patterned re-interconnection layers, a passive device, or the like.

In an exemplary embodiment, the first substrate bonding pad 111 may be connected to the first chip 120, and the second substrate bonding pad 112 may be connected to a second chip 130.

The large-sized second chip 130 having a cavity 140 may be attached to the reduced-sized first chip 120 by allowing the first chip 120 to be enclosed within an inner part of the cavity 140.

In an exemplary embodiment, the cavity 140 may be a three-dimensional space formed on a lower surface of the second chip 130 such that the first chip 120 may be placed within the cavity 140.

The first chip 120 and the second chip 130 may be, for example, an edge pad chip type in which chip pads 121 and 131 may be formed along all of four sides of the chips 120 and 130. In an exemplary embodiment, the chip pads 121 and 131 formed on the first and second chips 120 and 130, may be formed in a center pad type, or in an edge pad type in which the chip pads 121 and 131 may be formed along two sides of the chips 120 and 130.

Further, the first chip 120 and the second chip 130 may have active surfaces on which chip pads 121 and 131 may be formed. The active surfaces of the first chip 120 and the second chip 130 may be formed to face in the same direction (e.g., the active surfaces of both chips face upwardly). Non-active surfaces of the first and second chips 120 and 130, which may be the other side of the active surfaces, may be used for attachment purpose. The first chip 120 and the second chip 130 may be attached to the substrate 110 by a conductive adhesive and/or an insulating adhesive. It should be appreciated that other types of adhesives may be employed. It should also be appreciated that other attachment techniques may be employed to attach the first chip 120 and the second chip 130 to the substrate 110.

The chip pads 121 of the first chip 120 may be electrically connected to the first substrate bonding pad 111 by first bonding wires 151, and the chip pads 131 of the second chip 130 may be electrically connected to the second substrate bonding pad 112 by second bonding wires 152.

Specifically, the cavity 140 may be formed on the non-active surface of the second chip 130 by, for example, a selective etching process. It should be appreciated that other processes may be employed to form the cavity. The cavity 140 should be formed long enough to ensure that the height of the first chip 120 and the loop height of the first bonding wires 151 may fit within cavity 140.

The first chip 120, the first bonding wires 151 and bonding portions of the first bonding wires 151 within the cavity 140 may be encapsulated by an insulating layer 141. However, it should be understood that the insulating layer 141 need not be formed if an adhesive 160, used to attach the first and second chips 120 and 130 to the substrate 110 is applied as an insulating adhesive. However, if the adhesive 160 is applied as a conductive adhesive, the insulating layer 141 may then be formed which may act as an insulation material. In other words, when using the adhesive 160 as an insulating adhesive, the insulating layer 141 should not be formed so that the inner part of the cavity 140 may remain empty because the first chip 120 may be shielded by the second chip 130 regardless of whether the inner part of the cavity 140 may have been encapsulated.

The second chip 130, the second bonding wires 152 and bonding portions of the second bonding wires 152 may be encapsulated by a package body 170. Solder balls 180 may be attached to the terminals 115 of the substrate 110, which may be used as, for example, external connection terminals. The solder balls 180 may be electrically connected to the first chip 120 and the second chip 130 by connecting the solder balls 180 to the substrate bonding pads 111 and 112 through a circuit interconnection (not shown) formed on the substrate 110.

In an exemplary embodiment, a thickness t1 of the second chip 130 may be approximately 200-350 μm and a depth t2 of the cavity 140 formed in the middle of the non-active surface of the second chip 130 may be approximately 150-300 μm. Further, a thickness b of the first chip 120 located within the cavity 140, heights c and g of the bonding wires 151 and 152 of the first and second chips 120 and 130, and a thickness d between the bonding wires 151 of the first chip 120 and the cavity 140 may all be determined at a range of approximately 50-100 μm, respectively. In an exemplary embodiment, the thickness a of the adhesive 160 may be approximately 20-50 μm and a thickness h of the package body 170 may be approximately 300-450 μm.

In an exemplary embodiment, the reduced-sized first chip 120 located inside the cavity 140 may be a radio frequency (RF) chip and the large-sized second chip 130 having the cavity 140 may be a chip for a memory or a logic circuit. In general, the size of the RF chip should be approximately reduced in comparison to the large-sized chip.

A method of manufacturing the multi-chip package according to an exemplary embodiment of the present invention will be described in reference to FIGS. 3A through 5B and FIGS. 1 and 2.

In an exemplary embodiment, the reduced-sized first chip 120 having the plurality of chip pads 121 on an active surface A, and the large-sized second chip 130 having the plurality of chip pads 131 on the active surface C may be prepared.

Figure 3A:
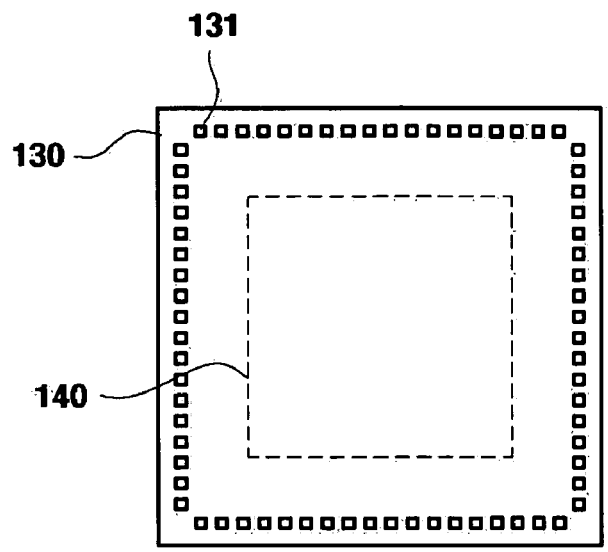
FIGS. 3A to 5B are views illustrating exemplary embodiments of each of the manufacturing process of the multi-chip package according to the present invention.
Figure 3B:
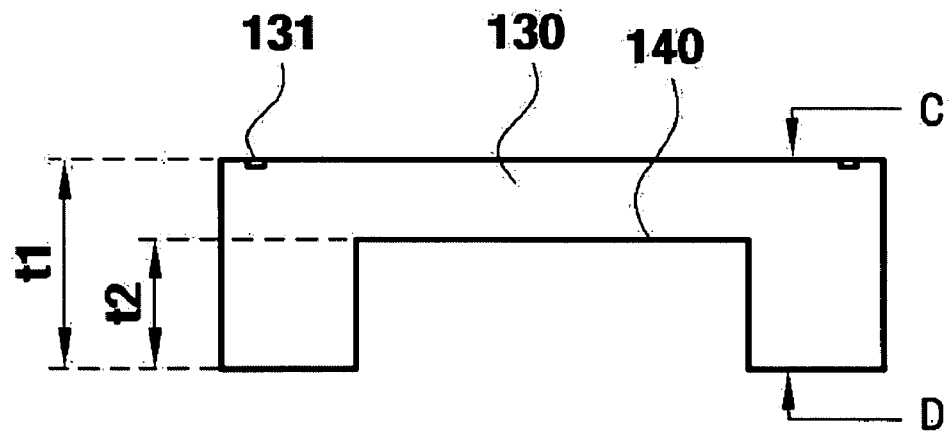

As shown in FIGS. 3A and 3B, the cavity 140 may be formed to a thickness t2 by performing, for example, a selective etching process. It should be appreciated that other processes may be employed to form the cavity. The selective etching process may use a mask on a non-active surface D of the second chip 130 having a thickness t1. Accordingly, in an exemplary embodiment, the cavity 140 should have enough space to enclose the first chip 120 and the bonding wires 121.

Figure 4A:
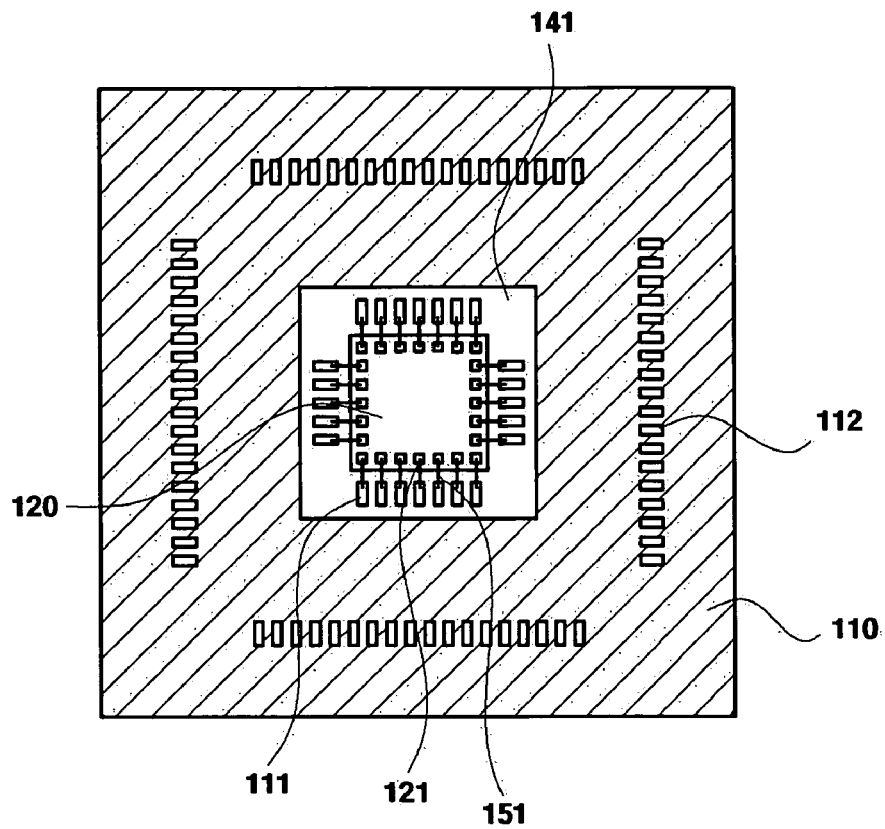
Figure 4B:
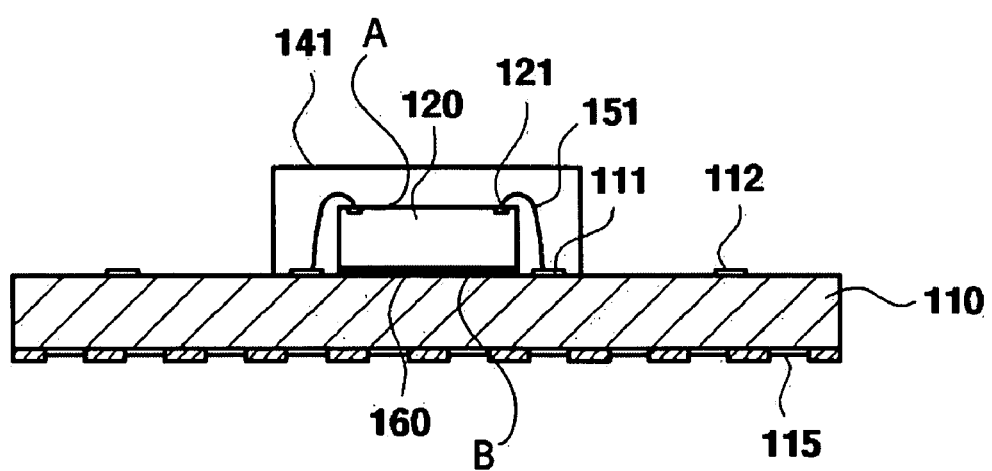

As shown in FIGS. 4A and 4B, the non-active surface B of the first chip 120 may be attached to the substrate 110 using a conductive adhesive or an insulating adhesive such as, epoxy. It should be appreciated that other types of adhesives may be employed. It should also be appreciated that other attachment techniques may be employed to attach the first chip 120 and the second chip 130 to the substrate 110. As an exemplary embodiment, the first chip 120 may be attached to the center of the cavity 140 on the substrate 110.

A first wire bonding process may be performed using the first bonding wires 151 made of a conductive material, for example, gold (Au) to electrically connect the chip pads 121 formed on the active surface A of the first chip 120 to the corresponding first substrate bonding pads 111 of the substrate 110. It should be appreciated that other conductive materials may be employed.

The insulating layer 141 molded by an epoxy resin may be formed to encapsulate the first chip 120, the first bonding wires 151 and the bonding portions of the first bonding wires 151. In an exemplary embodiment, the insulating layer 141 may be formed in such a way so as not to exceed the area of the cavity 140, and the insulating layer 141 may be formed to fill the inner space of the cavity 140. Accordingly, the insulating layer 141 may be formed or may not be formed depending on the kind of adhesive used to attach the first and second chips 120 and 130 to the substrate 110. In other words, if employing a conductive adhesive, the insulating layer 141 should be formed due to a molding process that reduces or prevents an electrical short-circuit from occurring and/or to ensure proper insulation characteristics. Alternatively, if employing an insulating adhesive, the insulating layer 141 should not be formed so as to simplify the manufacturing process and leave the inner space of the cavity 140 empty.

Figure 5A:
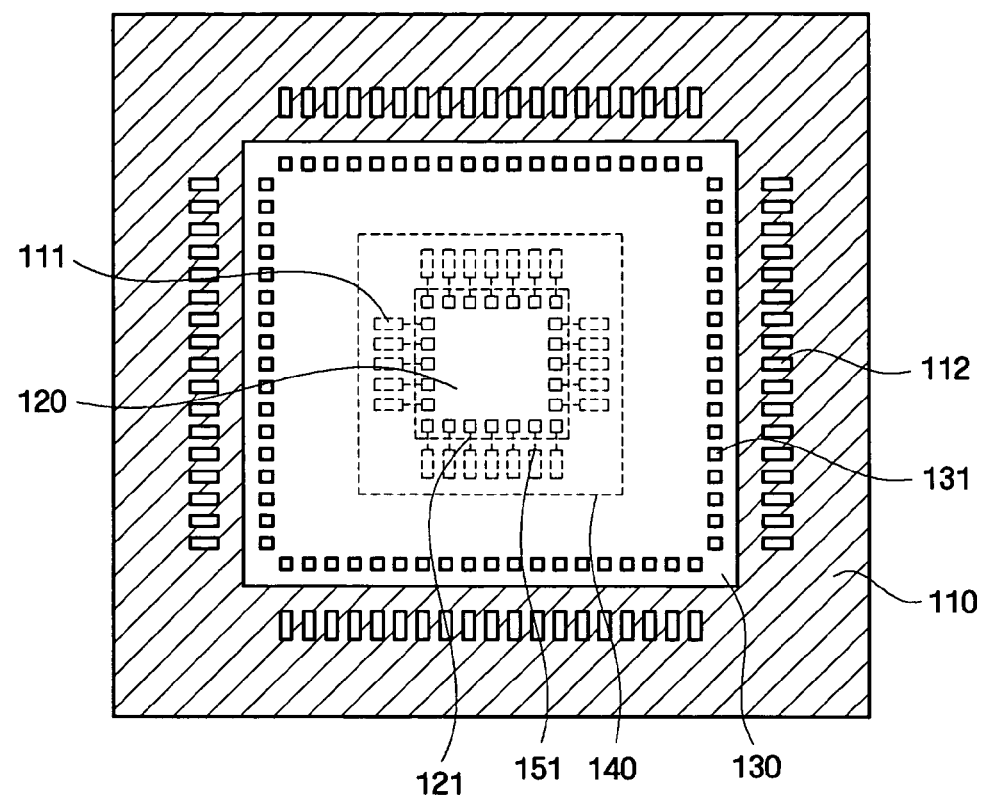
Figure 5B:
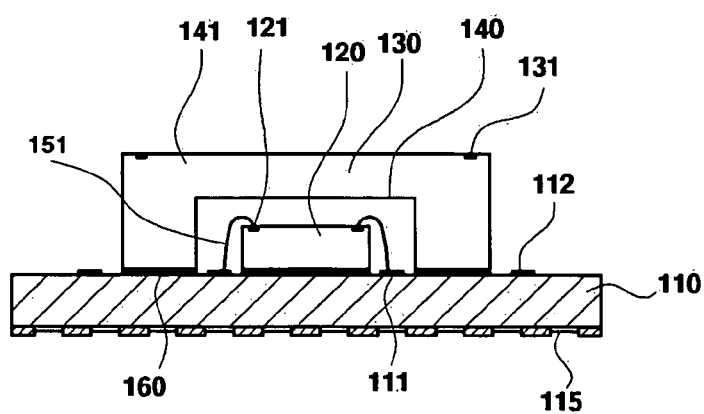

As shown in FIGS. 5A and 5B, the non-active surface D of the second chip 130 on which the cavity 140 is formed may be attached to the substrate 110 using, for example, a conductive adhesive or an insulating adhesive 160 (i.e., epoxy resin) to enclose the first chip 120 and the first bonding wires 151.

Referring back to FIGS. 1 and 2, a second wire bonding process may be performed using the second bonding wires 152.

The package body 170 made of, for example, epoxy resin may be formed by a molding process to encapsulate the second chip 130, the second bonding wires 152, and bonding portions of the second bonding wires 152.

After completing the molding process, the solder balls 180 may be attached to the terminals 115, which may be used as external connection terminals.

In an alternative exemplary embodiment, a flip-chip bonding method using bumps may be used to electrically connect the chip pads of the semiconductor chips to the substrate bonding pads.

Further, in another exemplary embodiment, a heterogeneous bonding method may be applied that may employ both the flip-chip bonding method and the wire-bonding method.

In accordance with the multi-chip package as described above (e.g., when the large-sized upper chip 130 is stacked over the reduced-sized lower chip 120), the upper chip 130 need not have a hang-over portion and a space for wire-bonding the lower chip may be provided without using a separate spacer. Further, the lower chip 120 may be isolated from noise generated by the upper chip 130.

Figure 6:
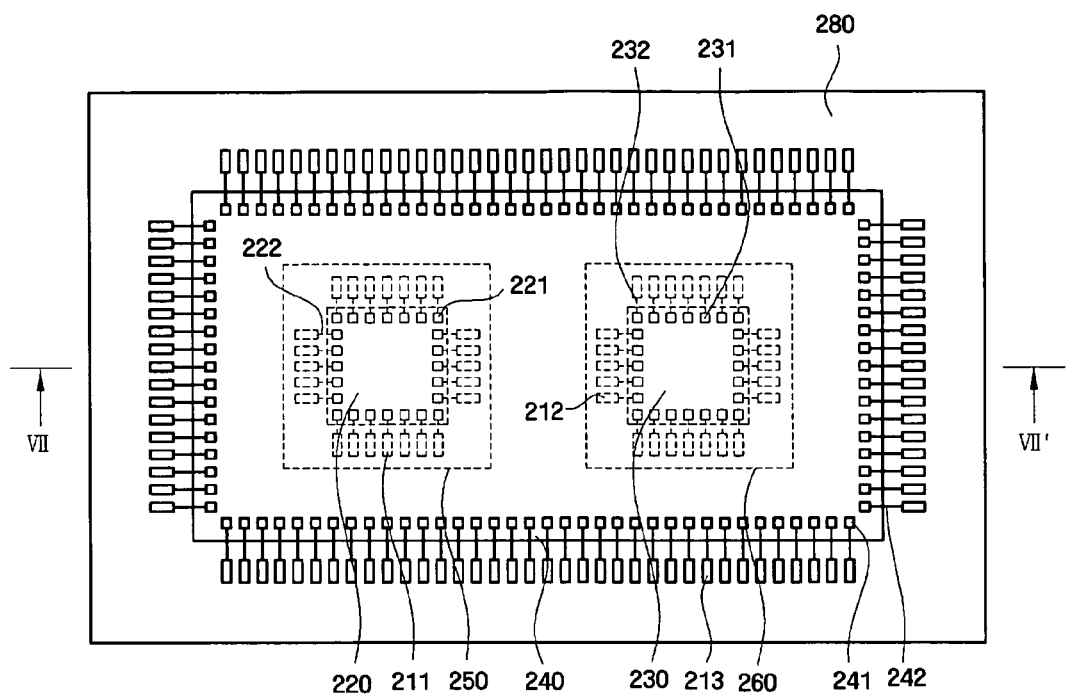
FIG. 6 is a plan view illustrating another exemplary embodiment of a multi-chip package according to the present invention.
Figure 7:
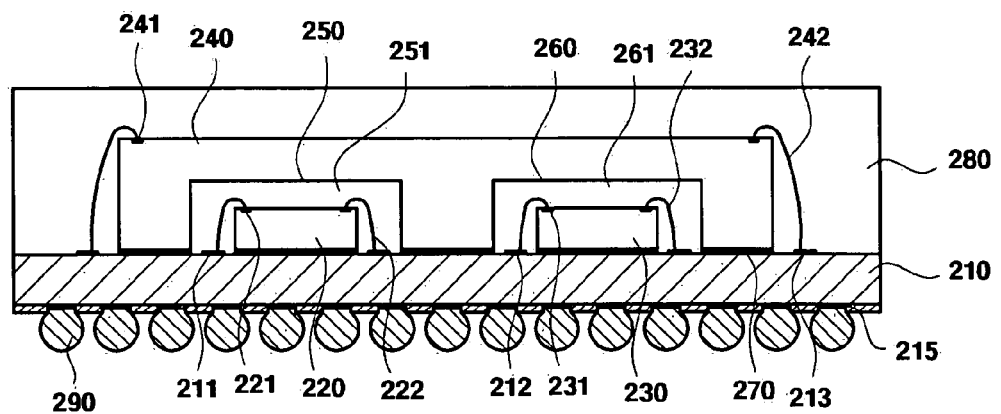
FIG. 7 is a cross-sectional view taken along a line VII-VII' of FIG. 6.

A multi-chip package according to another exemplary embodiment of the present invention is described in reference to FIGS. 6 and 7.

FIG. 6 is a plan view showing the multi-chip package according to another exemplary embodiment of the present invention, and FIG. 7 is a cross-sectional view taken along a line VII-VII' of FIG. 6.

As shown in FIGS. 6 and 7, a reduced-sized first chip 220 and a reduced-sized second chip 230 may be attached on an upper surface of substrate 210 of which a plurality of substrate bonding pads 211, 212 and 213 may be formed and/or on the lower surface of the substrate 210 of which a plurality of terminals 215 may be formed. It should be appreciated that the substrate used in the previous exemplary embodiments may be replaced with substrate 210.

In an exemplary embodiment, the first substrate bonding pad 211 may be connected to the first chip 220, the second substrate bonding pad 212 may be connected to the second chip 230, and the third substrate bonding pad 213 may be connected to a third chip 240.

The large-sized third chip 240 having first and second cavities 250 and 260, may be formed over the upper parts of the reduced-sized first and second chips 220 and 230. As a result, this allows the first and second chips 220 and 230 to be enclosed within an inner part of the first and second cavities 250 and 260, respectively.

The first, second and third chips 220, 230 and 240, respectively, may be, for example, an edge pad chip type in which chip pads 221, 231 and 241, respectively may be formed along all of four sides of the first, second and third chips 220, 230 and 240. In an exemplary embodiment, the chip pads 221, 231 and 241 formed on the first, second and third chips 220, 230 and 240 may be formed in a center pad type, or in an edge pad type in which the chip pads 221, 231 and 241 may be formed along two sides of each chip.

Further, active surfaces of the first, second and third chips 220, 230 and 240 where the chip pads 221, 231 and 241 may be formed may face in the same direction. Non-active surfaces of the first, second and third chips 221, 231 and 241, which may be the other side of the active surfaces, may be used for attachment purpose. The first, second and third chips 220, 230 and 240 may be attached to the substrate 210 by, for example, a conductive adhesive and/or an insulating adhesive 270. It should be appreciated that other types of adhesives may be employed. It should also be appreciated that other attachment techniques may be employed to attach the semiconductor chips 221, 231 and 241 to the substrate 210.

The chip pads 221 of the first chip 220 may be electrically connected to the first substrate bonding pad 211 by first bonding wires 222, and the chip pads 231 of the second chip may be electrically connected to the second substrate bonding pad 212 by second bonding wires 232. In addition, the chip pads 241 of the third chip 240 may be electrically connected to the third substrate bonding pad 241 by third bonding wires 242.

The first and second cavities 250 and 260, respectively, may be formed on a non-active surface of the third chip 240 by, for example, a selective etching process. It should be appreciated that other processes may be employed to form the cavities. The first and second cavities 250 and 260 should be formed long enough to ensure heights of the first and second chips 220 and 230 and loop heights of first and second bonding wires 222 and 232 may fit within the cavities 250, 260.

The first chip 220, the first bonding wires 222 and bonding portions of the first bonding wires 222 within the first cavity 250 may be encapsulated by a first insulating layer 251. Further, the second chip 230, the second bonding wires 232 and bonding portions of the second bonding wires 232 within the second cavity 260 may be encapsulated by a second insulating layer 261.

In an exemplary embodiment that uses an adhesive (e.g., an insulating adhesive) to attach the first, second and third chips 220, 230 and 240 to the substrate 210, the insulating layers 251 and 261 may not be formed. In an alternative exemplary embodiment that uses a conductive adhesive 270, the insulating layers 251 and 261 may then be formed with consideration of the required insulation characteristic. In other words, when using an insulating adhesive as the adhesive 270, the insulating layers 251 and 261 may not be formed and the inner parts of the cavities 250 and 260 may remain empty because the first and second chips 220 and 230 may be shielded by the third chip 240 regardless of whether the inner parts of the cavities 250 and 260 have been encapsulated.

The third chip 240, the third bonding wires 242 and bonding portions of the third bonding wires 242 may be encapsulated by a package body 280. Solder balls 290 may be attached to the terminals 215 of the substrate 210, which may be used as external connection terminals. The solder balls 290 may be electrically connected to the first, second and third chips 220, 230 and 240 by connecting the solder balls 290 to the substrate bonding pads 211 and 212 through a circuit interconnection (not shown) formed on the substrate 210.

Accordingly, as shown in exemplary embodiments, a multi-chip where the large-sized upper chip 240 may have plurality of cavities 250, 260 formed on the non-active surface thereof and a plurality of reduced-sized chips 220, 230 enclosed within the plurality of cavities 250, 260 may be configured.

In the multi-chip package according to exemplary embodiments of the present invention, when the large-sized upper chip is stacked over the reduced-sized lower chips, the upper chip may be prevented from having a hang-over portion and a space for wire-bonding the lower chips may be provided without using a separate spacer. Further, the lower chips may be isolated from noise generated by the upper chip. Furthermore, in a case where the plurality of lower chips may be located under the upper chip, an interference phenomenon, such as crosstalk, between the plurality of lower chips may be reduced or prevented.

It should be appreciated that the method of manufacturing the multi-chip package according to the previous exemplary embodiments may be substantially the same except that the first and second cavities 250 and 260 may be formed in an inner part of the third chip 240 where the first and second lower chips 220 and 230 may be placed.

Figure 8:
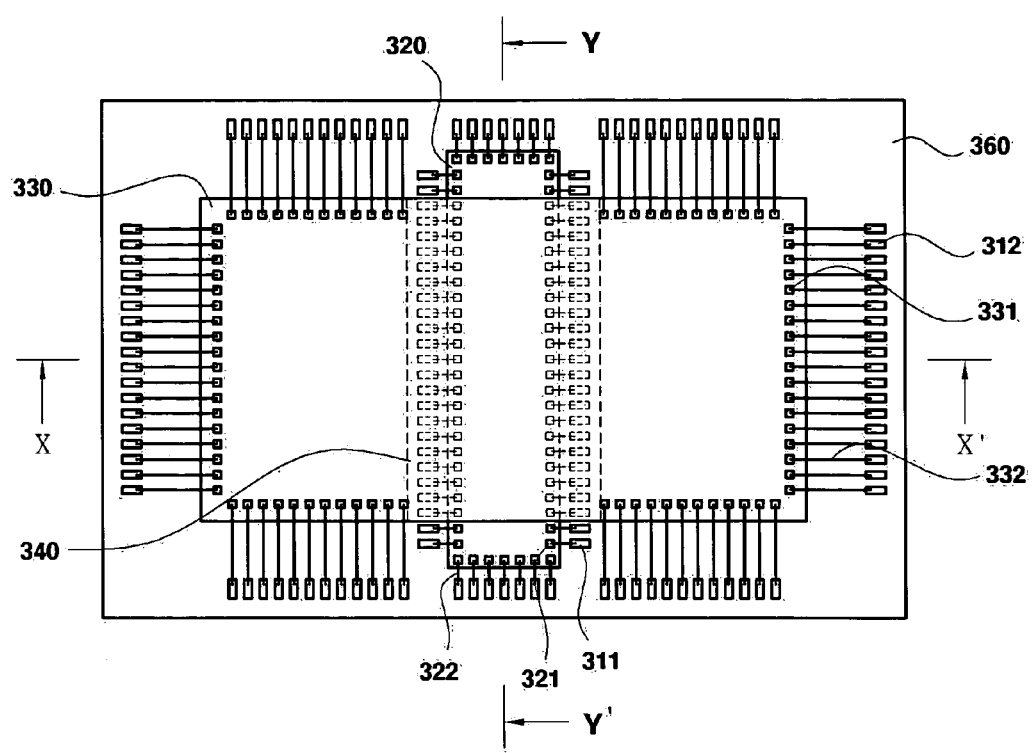
FIG. 8 is a plan view illustrating another exemplary embodiment of a multi-chip package according to the present invention.
Figure 9A:
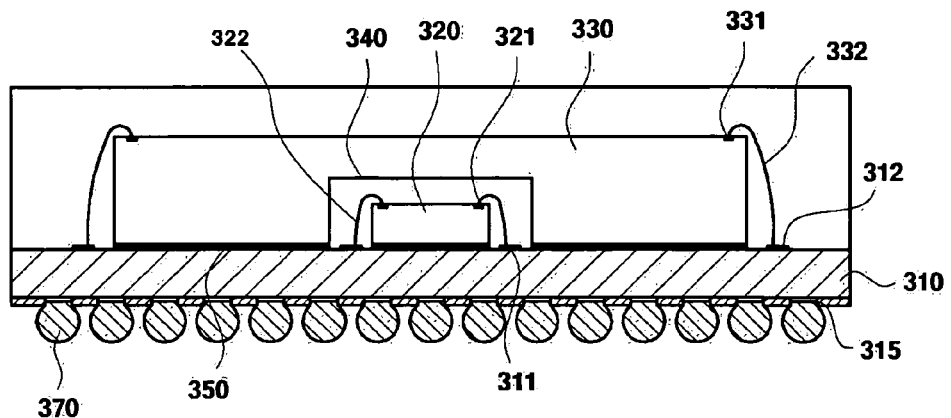
FIG. 9A is a cross-sectional view taken along a line X-X' of FIG. 8
Figure 9B:
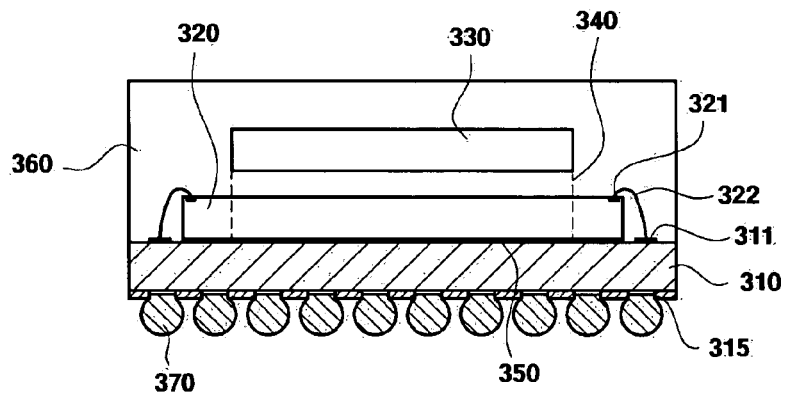
FIG. 9B is a cross-sectional view taken along a line Y-Y' of FIG. 8.

A multi-chip package according to another exemplary embodiment of the present invention is described in reference to FIGS. 8, 9A and 9B.

FIG. 8 is a plan view showing the multi-chip package according to another exemplary embodiment of the present invention. FIG. 9A is a cross-sectional view taken along a line X-X' of FIG. 8, and FIG. 9B is a cross-sectional view taken along a line Y-Y' of FIG. 8.

In the multi-chip package according to another exemplary embodiment of the present invention, as shown in FIGS. 8, 9A and 9B, a first chip 320 may be attached on an upper surface of a substrate 310 of which a plurality of substrate bonding pads 311 and 312 may be formed, and/or on a lower surface of the substrate 310 of which a plurality of terminals 315 may be formed. It should be appreciated that the same substrate used in the previous exemplary embodiments may replace the substrate 310.

In an exemplary embodiment, the first substrate bonding pad 311 may be connected to the first chip 320 and the second substrate bonding pad 312 may be connected to a second chip 330.

The second chip 330 having a groove 340 may be formed over an upper part of the rectangular first chip 320 allowing the first chip 320 to be enclosed within an inner part of the groove 340. Further, the second chip 330 may be stacked over the first chip 320 in a direction perpendicular to the first chip 320 and may be attached to the substrate 310. It should be appreciated that the first chip 320 and the second chip 330 may be a rectangular-like shape.

Further, the groove 340 may be formed as a three-dimensional space where the first chip 320 may be located. It should be understood that the groove 340 may pass through one direction of the second chip 330.

The first chip 320 and the second chip 330 may be, for example, an edge pad chip type in which chip pads 321 and 331 may be formed along all of four sides of the chips 320 and 330. In an exemplary embodiment, the chip pads 321 and 331 formed on the first and second chips 320 and 330 may be formed in a center pad type, or in an edge pad type in which the chip pads 321 and 331 may be formed along two sides of the chips 320 and 330.

Further, the first chip 320 and the second chip 330 may have an active surface. The active surfaces of the first chip 320 and the second chip 330 may be formed to face in the same direction. Non-active surfaces of the first and second chips 320 and 330, which may be the other side of the active surfaces, may be used for attachment purpose. The first chip 320 and the second chip 330 may be attached to the substrate 310 by, for example, a conductive adhesive and/or an insulating adhesive 350. It should be appreciated that other types of adhesives may be employed. It should also be appreciated that other attachment techniques may be employed to attach the first chip 320 and the second chip 330 to the substrate 310.

The chip pads 321 of the first chip 320 may be electrically connected to the first substrate bonding pad 311 by first bonding wires 322, and the chip pads 331 of the second chip 330 may be electrically connected to the second substrate bonding pad 312 by second bonding wires 332.

In an exemplary embodiment, the groove 340 may be formed on the non-active surface of the second chip 330 by, for example, a selective etching process. It should be appreciated that other processes may be employed to form the groove. The hollowed depth of the groove 340 should be formed long enough to ensure a height of the first chip 320 and a loop height of first bonding wires 322 may fit within the groove 340.

The first and second chips 320 and 330, the first and second bonding wires 322 and 332 and bonding portions of the first and second bonding wires 322 and 332 may be encapsulated by a package body 360. Solder balls 370 may be attached to the terminals 315 of the substrate 310, which may be used as, for example, external connection terminals. The solder balls 370 may be electrically connected to the first chip 320 and the second chip 330 by connecting the solder balls 370 to the substrate bonding pads 311 and 312 through a circuit interconnection (not shown) formed on the substrate 310.

A method of manufacturing the multi-chip package according to another exemplary embodiment of the present invention is described in reference to FIGS. 10A through 12B and FIGS. 8, 9A and 9B.

Figure 10A:
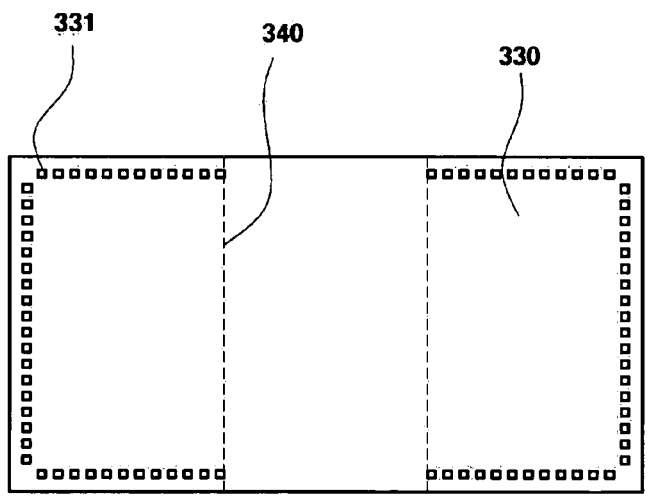
FIGS. 10A to 12B are views illustrating another exemplary embodiments of each of the manufacturing process of the multi-chip package according to the present invention.
Figure 10B:
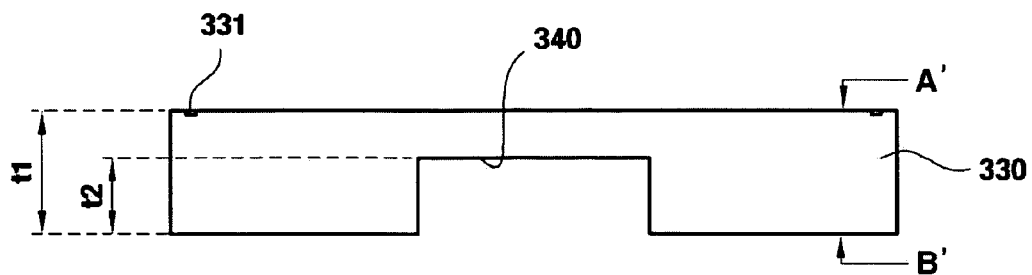

The first chip 320 having the plurality of chip pads 321 and the second chip 330 having the plurality of chip pads 331 may be prepared on an active surface A'. As shown in FIGS. 10A and 10B, the second chip 330 may be formed to have a thickness t1 and the groove 340 may be formed to have a depth t2 by performing the selective etching process on a non-active surface B' of the second chip 330 using a mask. In an exemplary embodiment, the groove 340 should have enough space to enclose the first chip 320 and the first bonding wires 321.

Figure 11A:
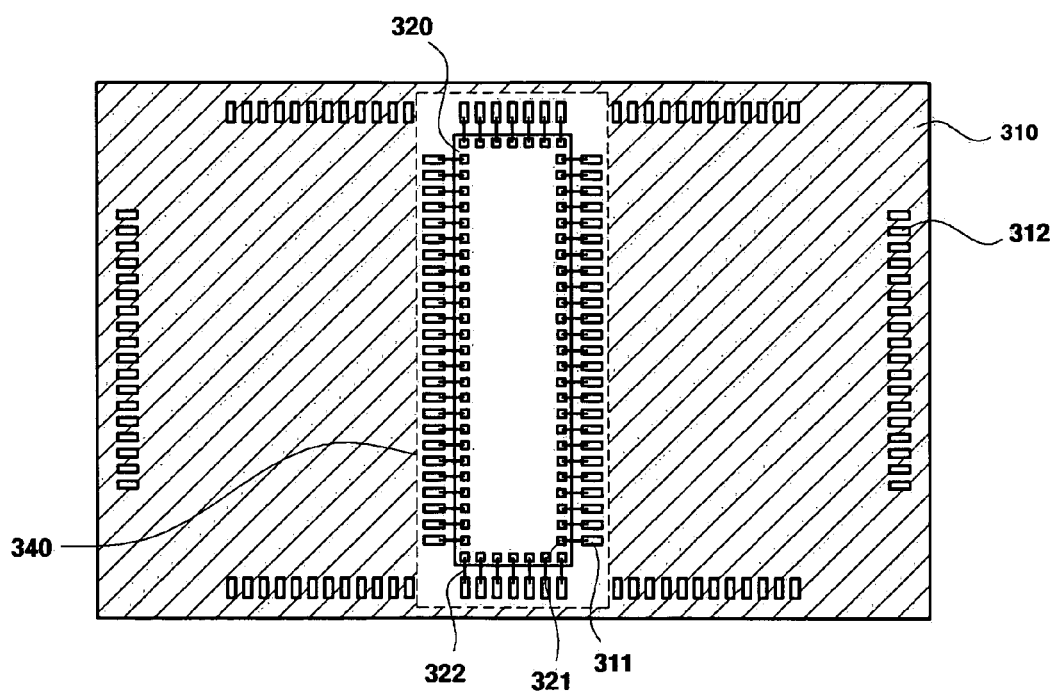
Figure 11B:
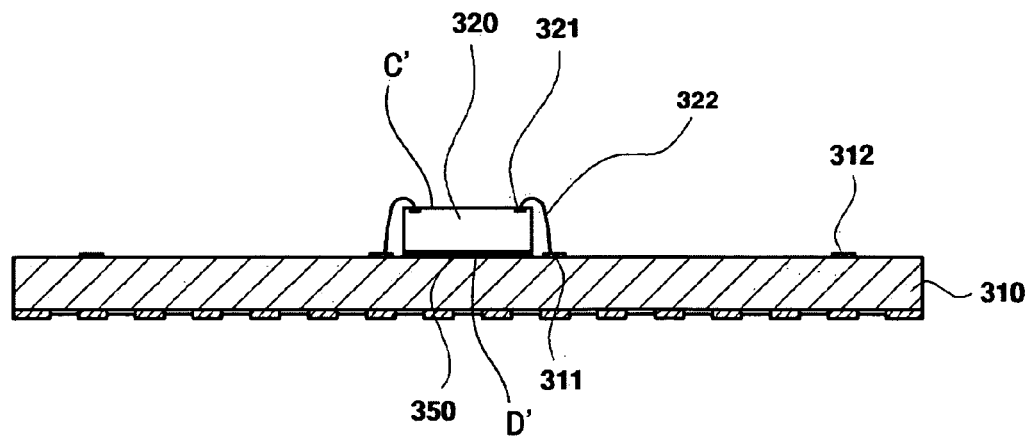

As shown in FIGS. 11A and 11B, the non-active surface D' of the first chip 320 may be attached to the substrate 310 using, for example, a conductive adhesive and/or an insulating adhesive 350, such as epoxy. It should be appreciated other adhesives may be employed. It should also be appreciated that other attachment techniques may be employed to attach the first chip 320 to the substrate 310. In an exemplary embodiment, the rectangular first chip 320 may be attached along a region where the groove 340 is to be formed on the substrate 310.

A first wire bonding process may be performed using the first bonding wires 322 made of a conductive material, for example, a gold (Au) wire, to electrically connect the chip pads 321 formed on the active surface C' of the first chip 320 to the corresponding first substrate bonding pads 311 of the substrate 310. It should be appreciated that other types of conductive material may be employed.

Figure 12A:
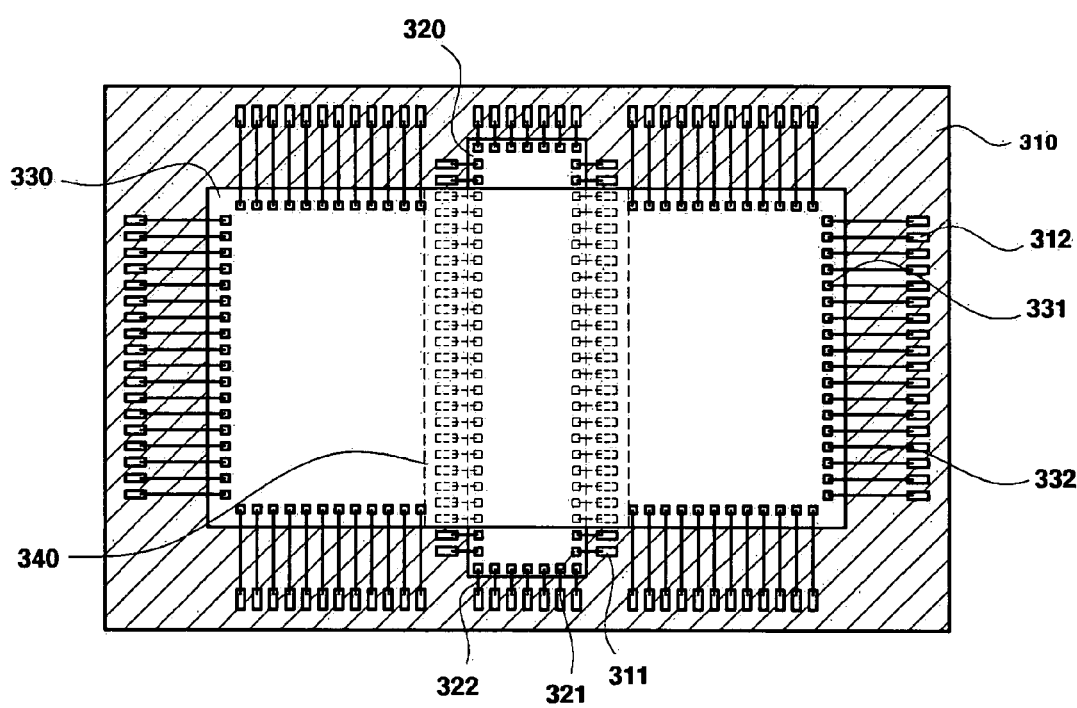
Figure 12B:
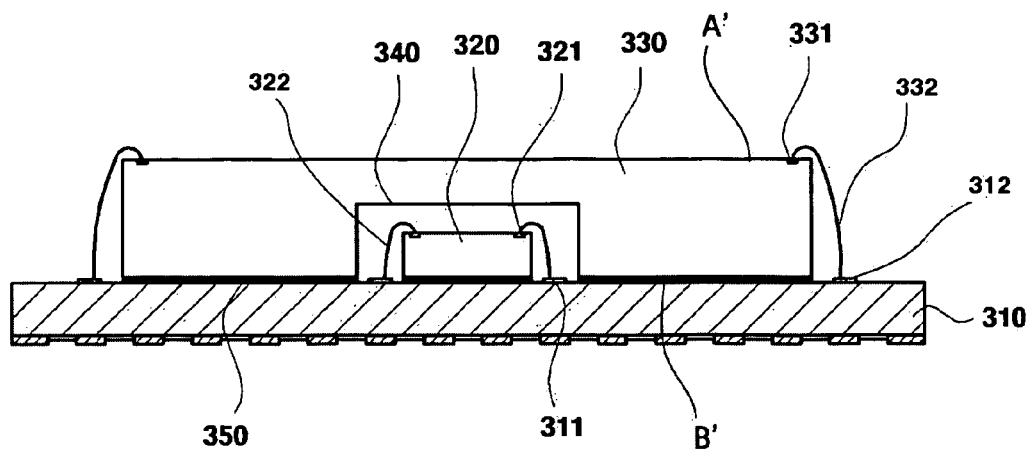

As shown in FIGS. 12A and 12B, the non-active surface B' of the second chip 330 on which the groove 340 is formed may be attached on the substrate 310 using the conductive adhesive and/or the insulating adhesive 350, such as epoxy resin to enclose the first chip 320 and the first bonding wires 321. It should be appreciated other adhesives may be employed. It should also be appreciated that other attachment techniques may be employed to attach the second chip 330 to the substrate 310.

A second wire bonding process may be performed using the second bonding wires 332 made of a conductive material, for example, a gold (Au) wire to electrically connect the chip pads 331 formed on the active surface of the second chip 330 to the corresponding second substrate bonding pads 312 of the substrate 310. Again, it should be appreciated that other types of conductive material may be employed.

Referring back to FIGS. 8, 9A and 9B, the package body 360 made of epoxy resin may be formed by a molding process to encapsulate the first and second chips 320 and 330, the first and second bonding wires 322 and 332 and bonding portions of the first and second bonding wires 322 and 332.

After completing the molding process, the solder balls 370 that may be used as external connection terminals may be attached to the terminals 315.

Accordingly, as an exemplary embodiment, a flip-chip bonding method using bumps may be used to electrically connect the chip pads of the semiconductor chips to the substrate bonding pads.

Further, in another exemplary embodiment, a heterogeneous bonding method may be applied that uses both the flip-chip bonding method and the wire-bonding method.

Figure 13:
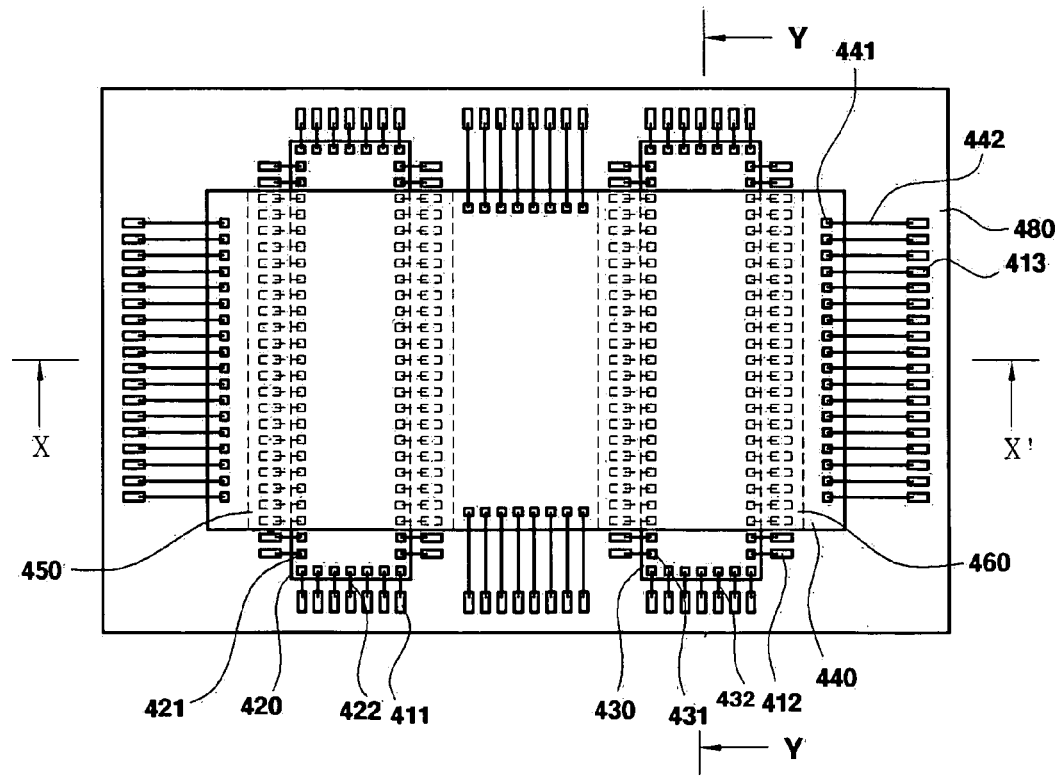
FIG. 13 is a plan view illustrating another exemplary embodiment of a multi-chip package according to the present invention.
Figure 14A:
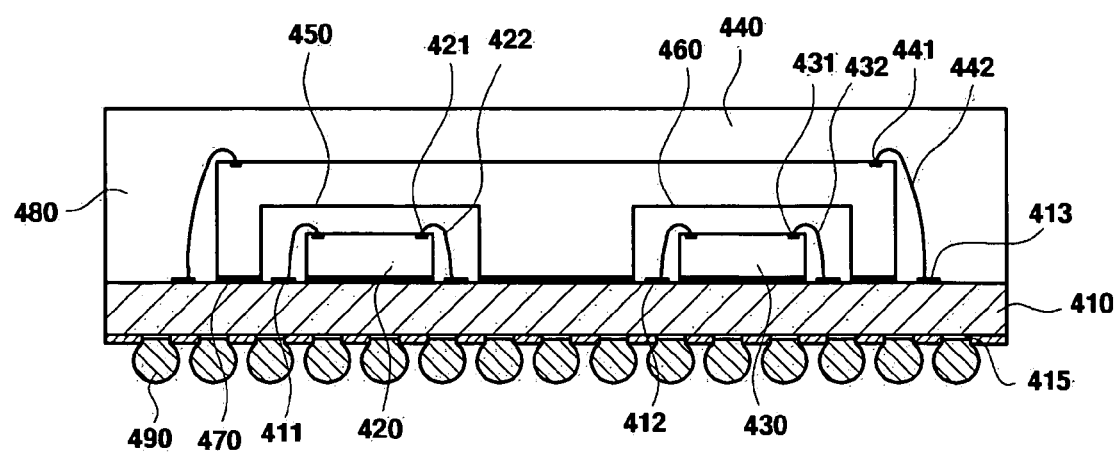
FIG. 14A is a cross-sectional view taken along a line X-X' of FIG. 13
Figure 14B:
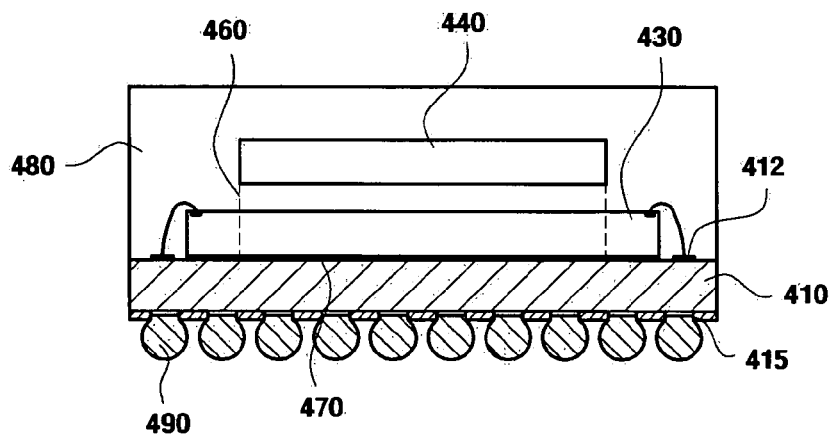
FIG. 14B is a cross-sectional view taken along a line Y-Y' of FIG. 13.

A multi-chip package according to another exemplary embodiment of the present invention is described in reference to FIGS. 13, 14A and 14B.

FIG. 13 is a plan view showing the multi-chip package according to another exemplary embodiment of the present invention. FIG. 14A is a cross-sectional view taken along a line X-X' of FIG. 13, and FIG. 14B is a cross-sectional view taken along a line Y-Y' of FIG. 13.

In the multi-chip package according to another exemplary embodiment of the present invention, as shown in FIGS. 13, 14A and 14B, rectangular first and second chips 420 and 430 may be attached side by side on an upper surface of a substrate 410 of which a plurality of substrate bonding pads 411, 412 and 413 may be formed, and/or on a lower surface of the substrate 410 of which a plurality of terminals 415 may be formed. It should be appreciated that the same substrate used in the previous exemplary embodiments may be replaced as the substrate 410.

In an exemplary embodiment, the first substrate bonding pad 411 may be connected to the first chip 420, the second substrate bonding pad 412 may be connected to the second chip 430, and the third substrate bonding pad 413 may be connected to a third chip 440.

The rectangular third chip 440 having first and second grooves 450 and 460, respectively, may be formed over upper parts of the rectangular first and second chips 420 and 430 allowing the first and second chips 420 and 430 to be enclosed within the inner parts of the first and second grooves 450 and 460. Further, the third chip 440 may be stacked over the first and second chips 420 and 430 in a direction perpendicular to the first and second chips 420 and 430 and may be attached to the substrate 410.

The first, second and third chips 420, 430 and 440, respectively, may be, for example, an edge pad chip type in which chip pads 421 and 431, may be formed along all of four sides of each of the corresponding chips 420 and 430, and chip pads 441 may be formed along four sides other than where the first and second grooves 450 and 460 may be positioned. In an exemplary embodiment, the chip pads 421, 431 and 441, formed on the first, second and third chips 420, 430 and 440, may be formed in a center pad type, or in an edge pad type in which the chip pads 421, 431 and 441 may be formed along two sides of each chip.

Further, active surfaces of the first, second and third chips 420, 430 and 440, respectively, on which the chip pads 421, 431 and 441 may be formed, may face in the same direction. Non-active surfaces of the first, second and third chips 421, 431 and 441, respectively, which may be the other side of the active surfaces, may be used in the attachment purpose. The first, second and third chips 420, 430 and 440 may be attached to the substrate 410 by, for example, a conductive adhesive and/or an insulating adhesive 470. It should be appreciated that other types of adhesives may be employed. It should also be appreciated that other attachment techniques may be employed to attach the chips 420, 430 and 440 to the substrate 410.

The chip pads 421 of the first chip 420 may be electrically connected to the first substrate bonding pad 411 by first bonding wires 422, and the chip pads 431 of the second chip 430 may be electrically connected to the second substrate bonding pad 412 by second bonding wires 432. In addition, the chip pads 441 of the third chip 440 may be electrically connected to the third substrate bonding pad 441 by third bonding wires 442.

In an exemplary embodiment, the first and second grooves 450 and 460 may be formed on a non-active surface of the third chip 440 by, for example, a selective etching process. It should be appreciated that other processes may be employed to form the grooves. The hollowed depths of the first and second grooves 450 and 460 should be formed long enough to ensure heights of the first and second chips 420 and 430 and loop heights of first and second bonding wires 421 and 431 may fit within the grooves.

The first, second and third chips 420, 430 and 440, the first, second and third bonding wires 422, 432 and 442, and bonding portions of the first, second and third bonding wires 422, 432 and 442 may be encapsulated by a package body 480. Solder balls 490 that may be used as external connection terminals may be attached to the terminals 415 of the substrate 410. The solder balls 490 may be electrically connected to the first chip 420, the second chip 430 and the third chip 440 by connecting the solder balls 490 to the substrate bonding pads 411, 412 and 413 through a circuit interconnection (not shown) formed on the substrate 410.

A method of manufacturing the multi-chip package according to an exemplary embodiment of the present invention may be carried out in a similar manner to the method of manufacturing the multi-chip package according to the previous exemplary embodiments of the present invention.

In an alternative exemplary embodiment, it should be appreciated that a plurality of packages may be generally manufactured at the same time and then separated into individual packages in the final stage of the process.

Further, it should be appreciated that a multi-chip package simultaneously having one or more cavities and/or one or more grooves may be manufactured by combining various aspects of the described above exemplary embodiments of the present invention.

Figure 15:
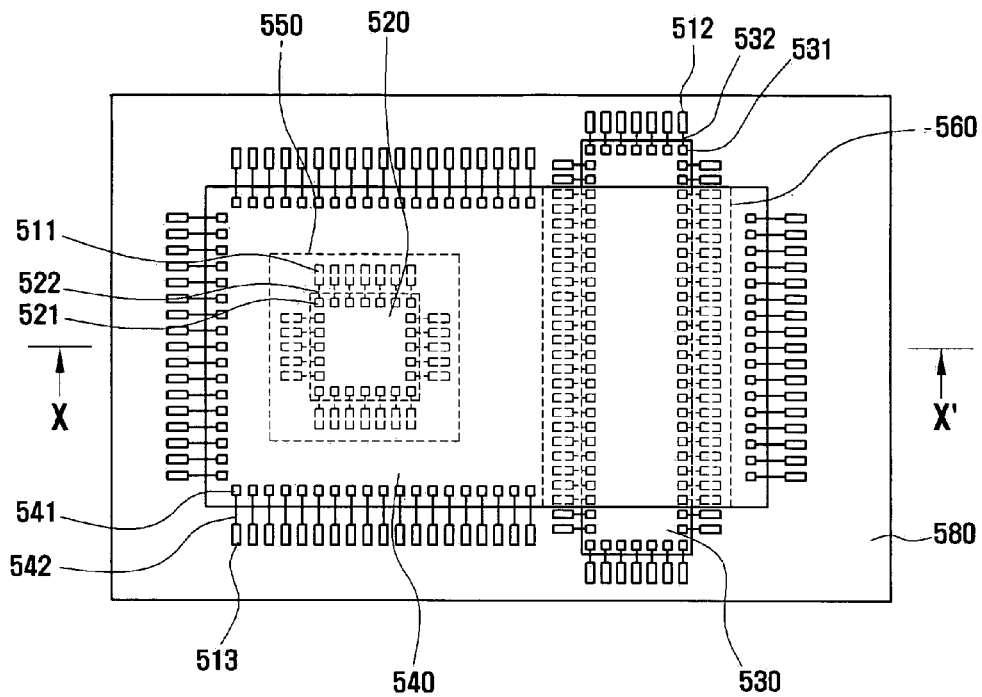
FIG. 15 is a plan view illustrating another exemplary embodiment of a multi-chip package according to the present invention.
Figure 16:
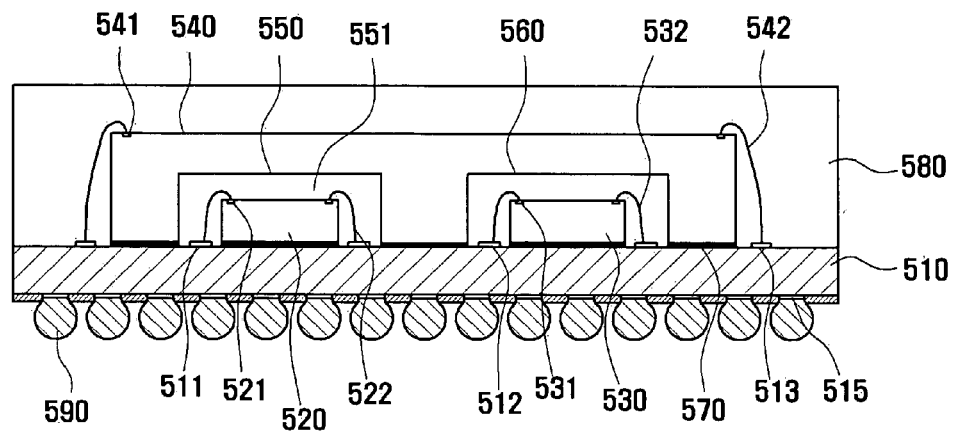
FIG. 16 is a cross-sectional view taken along a line X-X' of FIG. 15.

In another exemplary embodiment, a multi-chip package according to another exemplary embodiment of the present invention is described in reference to FIGS. 15 and 16.

FIG. 15 is a plan view showing the multi-chip package according to another exemplary embodiment of the present invention, and FIG. 16 is a cross-sectional view taken along a line X-X' of FIG. 15.

In the multi-chip package according to another exemplary embodiment of the present invention, as shown in FIGS. 15 and 16, a reduced-sized first chip 520 and a second chip 530 may be respectively attached on an upper surface of a substrate 510 of which a plurality of substrate bonding pads 511, 512 and 513 may be formed, and/or on a lower surface of the substrate 510 of which a plurality of terminals 515 may be formed. As an exemplary embodiment, the second chip 530 may be in a rectangular-like shape. It should be appreciated that the same substrate in the previous exemplary embodiments may be replaced as the substrate 510.

In an exemplary embodiment, the first substrate bonding pad 511 may be connected to the reduced-sized first chip 520, the second substrate bonding pad 512 may be connected to the rectangular second chip 530, and the third substrate bonding pad 513 may be connected to a large-sized third chip 540.

The large-sized third chip 540 having a cavity 550 and a groove 560 may be stacked or formed over the reduced-sized first chip 520 and the rectangular second chip 530.

Specifically, the large-sized third chip 540 may be attached to the substrate 510 allowing the reduced-sized first chip 520 to be enclosed within an inner part of the cavity 550, and the rectangular second chip 530 to be enclosed within an inner part of the groove 560.

The first, second and third chips 520, 530 and 540, respectively, may be, for example, an edge pad chip type in which chip pads 521, 531 and 541, respectively, may be formed along all of four sides of the first, second and third chips 520, 530 and 540. In an exemplary embodiment, the chip pads 521, 531 and 541 formed on the first and second chips 520, 530 and 540 may be formed in a center pad type, or in an edge pad type in which the chip pads 521, 531 and 541 may be formed along two sides of each chip.

Further, active surfaces of the first, second and third chips 520, 530 and 540, of which the chip pads 521, 531 and 541 may be formed, may face in the same direction. Non-active surfaces of the first, second and third chips 521, 531 and 541, which may be the other side of the active surfaces, may be used in attachment purpose. The first, second and third chips 520, 530 and 540 may be attached to the substrate 510 by, for example, a conductive adhesive and/or an insulating adhesive 570. It should be appreciated that other types of adhesives may be employed. It should also be appreciated that other attachment techniques may be employed to attach the chips 520, 530 and 540 to the substrate 510.

The chip pads 521 of the first chip 520 may be electrically connected to the first substrate bonding pad 511 by first bonding wires 522, and the chip pads 531 of the second chip 530 may be electrically connected to the second substrate bonding pad 512 by second bonding wires 532. In addition, the chip pads 541 of the third chip 540 may be electrically connected to the third substrate bonding pad 541 by third bonding wires 542.

In an exemplary embodiment, the cavity 550 and the groove 560 may be formed on a non-active surface of the third chip 540 by, for example, a selective etching process. In other words, the cavity 550 and the groove 560 may constitute a three-dimensional space inside the third chip 540. It should be appreciated that other processes may be employed to form the grooves. The cavity 550 and the groove 560 should each be formed long enough to ensure heights of the reduced-sized first chip 520 and the rectangular second chip 530 and loop heights of first and second bonding wires 522 and 532 may fit within the cavity 550 or groove 560.

The first chip 520, the first bonding wires 522 and bonding portions of the first bonding wires 522 within the cavity 550 may be encapsulated by an insulating layer 551.

In an exemplary embodiment, where the insulating adhesive 570 may be used, the insulating layer 551 may be formed with consideration of the required insulation characteristic. In other words, if an insulating adhesive 570 is employed as an adhesive, the insulating layer 541 may not be formed and the inner part of the cavity 540 may remain empty because the first chip 520 may be shielded by the second chip 530 regardless of whether the inner part of the cavity 540 has been encapsulated.

The second and third chips 530 and 540, the second and third bonding wires 532 and 542 and bonding portions of the second and third bonding wires 532 and 542, respectively, may be encapsulated by a package body 580. Solder balls 590 may be attached to the terminals 515 of the substrate 510 which may be used as external connection terminals. The solder balls 590 may be electrically connected to the first chip 520, the second chip 530 and the third chip 540 by connecting the solder balls 590 to the substrate bonding pads 511, 512 and 513 through a circuit interconnection (not shown) formed on the substrate 510.

Accordingly, as shown in an exemplary embodiment, a multi-chip in which the large-sized upper chip 540 may have a plurality of cavities 550 and a plurality of grooves 560 formed on a non-active surface thereof, and a plurality of reduced-sized chips 520 and a plurality of rectangular chips 530 enclosed within the plurality of cavities 550 and grooves 560 may be configured.

Figure 17:
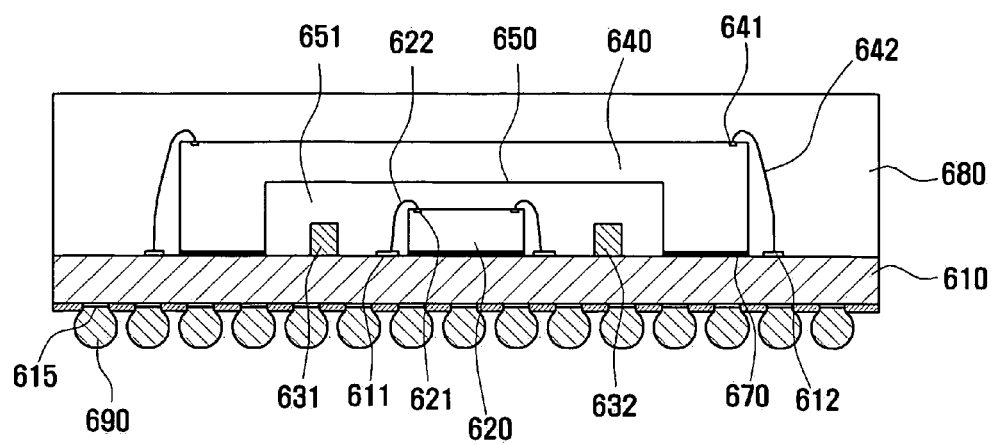
FIG. 17 is a cross-sectional view illustrating an exemplary embodiment of a multi-chip package according to the present invention.

In another exemplary embodiment, a multi-chip package according to another exemplary embodiment of the present invention is described in reference to FIG. 17.

FIG. 17 is a cross-sectional view showing the multi-chip package according to another exemplary embodiment of the present invention.

As shown in FIG. 17, a reduced-sized first chip 620 and first and second passive devices 631 and 632 may be attached on an upper surface of a substrate 610 of which a plurality of substrate bonding pads 611 and 612 may be formed, and/or on the lower surface of the substrate 610 of which a plurality of terminals 615 may be formed. It should be appreciated that the same substrate in the previous exemplary embodiments may be replaced as the substrate 610.

In an exemplary embodiment, the first substrate bonding pad 611 may be connected to the reduced-sized first chip 620, and the second substrate bonding pad 612 may be connected to a second chip 640. Further, the first and second passive devices 631 and 632 may be, for example, but not limited to, a capacitance device, an induction device and/or a resistance device.

The large-sized second chip 640 having a cavity 650 may be stacked on upper parts of the reduced-sized first chip 620, and the first and second passive devices 631 and 632 may be attached on the substrate 610 allowing the reduced-sized first chip 620 and the first and second passive devices 631 and 632 to be enclosed within an inner part of the cavity 650.

Specifically, the cavity 650 may be formed in the form of a three-dimensional space by making a lower surface of the large-sized second chip 640 recessed. In an exemplary embodiment, the three-dimensional space may have the form of the above-described groove.

The first and second chips 620 and 640, respectively, may be, for example, an edge pad chip type in which chip pads 621 and 641 may be formed along all four sides of the chips 620 and 640. In an exemplary embodiment, the chip pads 621 and 641 formed on the first and second chips 620 and 640 may be formed in a center pad type, or in an edge pad type in which the chip pads 621 and 641 may be formed along two sides of the chips 620 and 640.

Further, active surfaces of the first chip 620 and the second chip 640 on which the chip pads 621 and 641 may be formed may face in the same direction. Non-active surfaces of the first and second chips 620 and 640, which may be the other side of the active surfaces, may be used in attachment purpose. The first chip 620 and the second chip 640 may be attached to the substrate 610 by, for example, a conductive adhesive and/or an insulating adhesive 670. Further, in an exemplary embodiment, the first and second passive devices 631 and 632 may be attached to the substrate 610 by, for example, a conductive adhesive. It should be appreciated that other adhesives may be employed to attach the chips and/or passive devices to the substrate. It should also be appreciated that other attachment techniques may be employed to attach the chips and passive devices to the substrate.

The chip pads 621 of the first chip 620 may be electrically connected to the first substrate bonding pad 611 by first bonding wires 622, and the chip pads 641 of the second chip 640 may be electrically connected to the second substrate bonding pad 612 by second bonding wires 642.

In an exemplary embodiment, the cavity 650 should be formed long enough to ensure a height of the reduced-sized first chip 620, heights of the first and second passive devices 631 and 632 and a loop height of the first bonding wires 622 may fit within the cavity 650. The first chip 620, the first and second passive devices 631 and 632, the first bonding wires 622 and bonding portions of the first bonding wires 622 within the cavity 650 may be encapsulated by an insulating layer 651.

The second chip 640, the second bonding wires 642 and bonding portions of the second bonding wires 642 may be encapsulated by a package body 680. Solder balls 690 may be attached to the terminals 615 of the substrate 610 which may be used as, for example, external connection terminals. The solder balls 690 may be electrically connected to the first chip 620 and the second chip 640 by connecting the solder balls 690 to the substrate bonding pads 611 and 612 through a circuit interconnection (not shown) formed on the substrate 610.

Accordingly, as shown in exemplary embodiments, a multi-chip in which a plurality of cavities or a plurality of grooves or a combination thereof may be formed on the non-active surface of the large-sized upper chip.

Figure 18:
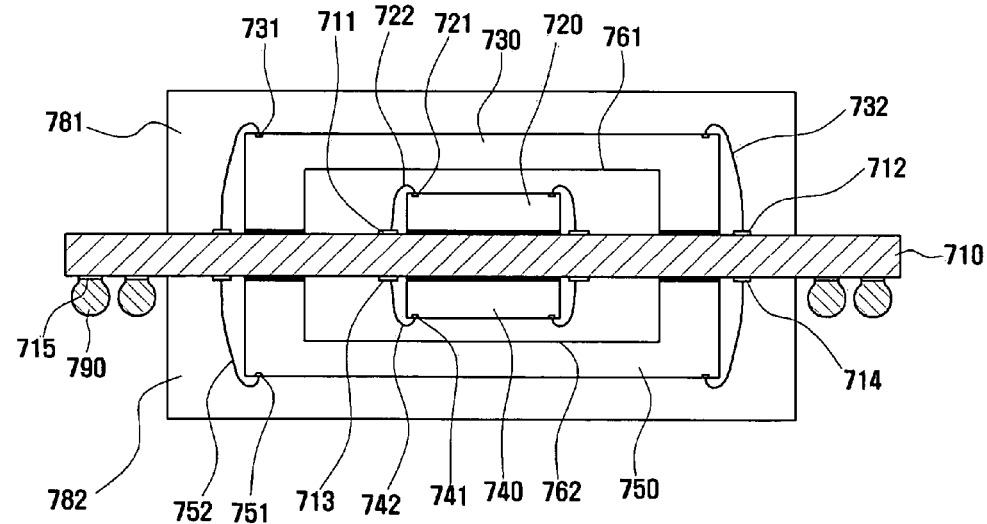
FIG. 18 is a cross-sectional view illustrating another exemplary embodiment of a multi-chip package according to the present invention.

A multi-chip package according to another exemplary embodiment of the present invention is described in reference to FIG. 18.

FIG. 18 is a cross-sectional view showing the multi-chip package according to another exemplary embodiment of the present invention.

In the multi-chip package according to another exemplary embodiment of the present invention, as shown in FIG. 18, multi-chips may be stacked on an upper part and a lower part of a substrate 710. As an exemplary embodiment, a plurality of substrate bonding pads 711 and 712 may be formed on an upper surface, and a plurality of substrate bonding pads 713 and 714 and a plurality of terminals 715 may be formed on a lower surface.

In an exemplary embodiment, the substrate 710 may perform a part of an interposer as discussed above, which may be capable of stacking the multi-chips on the upper part and the lower part of the substrate 710. Further, the same substrate in the previous exemplary embodiments of the present invention may be replaced with the substrate 710.

A reduced-sized first chip 720 may be attached to the upper part of the substrate 710. A large-sized second chip 730 having a three-dimensional space 761 in the form of a cavity or a groove on the first chip 720 may be attached to the upper part of the substrate 710 allowing the reduced-sized first chip 720 to be enclosed by an inner part of the three-dimensional space 761.

In the same manner as the first and second chips 720 and 730, a reduced-sized third chip 740 may be attached to the lower part of the substrate 710 directly opposite the first chip 720 with respect to the position on the substrate 710. A large-sized fourth chip 750 having a three-dimensional space 762 in the form of a cavity or a groove on the third chip 740 may be attached to the upper part of the substrate 710 allowing the reduced-sized third chip 740 to be enclosed within an inner part of the three-dimensional space 762.

In an exemplary embodiment, the three-dimensional spaces 761 and 762 may be formed on non-active surfaces of the second chip 730 and the fourth chip 750, respectively.

In other exemplary embodiments, the first substrate bonding pad 711 may be connected to the first chip 720, the second substrate bonding pad 712 may be connected to the second chip 730, the third substrate bonding pad 713 may be connected to the third chip 740, and the fourth substrate bonding pad 714 may be connected to the fourth chip 750.

The first, second, third and fourth chips 720, 730, 740 and 750, respectively, may be, for example, an edge pad chip type in which chip pads 721, 731, 741 and 751, respectively, may be formed along all of four sides of each of the corresponding chips 720, 730, 740 and 750. In an exemplary embodiment, the chip pads 721, 731, 741 and 751 formed on the first, second, third and fourth chips 720, 730, 740 and 750 may be formed in a center pad type, or in an edge pad type in which the chip pads 721, 731, 741 and 751 may be formed along two sides of each chip.

The chip pads 721 of the first chip 720 may be electrically connected to the first substrate bonding pad 711 by first bonding wires 722, and the chip pads 731 of the second chip 730 may be electrically connected to the second substrate bonding pad 712 by second bonding wires 732. In addition, the chip pads 741 of the third chip 740 may be electrically connected to the third substrate bonding pad 713 by third bonding wires 742, and the chip pads 751 of the third chip 750 may be electrically connected to the fourth substrate bonding pad 714 by fourth bonding wires 752.

The second and fourth chips 730 and 750, the second and fourth bonding wires 732 and 752 and bonding portions of the second and fourth bonding wires 732 and 752 may be encapsulated by package bodies 781 and 782, respectively.

Solder balls 790 that may be used as, for example, external connection terminals may be attached to the terminals 715 of the substrate 710. The solder balls 790 may be electrically connected to the first, second, third and fourth chips 720, 730, 740 and 750 by connecting the solder balls 790 to the substrate bonding pads 721, 731, 741 and 751 through a circuit interconnection (not shown) formed on the substrate 710.

Accordingly, exemplary embodiments illustrate multi-chips in which a plurality of cavities or a plurality of grooves or a combination thereof may be formed on the upper and/or lower surfaces of the substrate.

Accordingly, exemplary embodiments illustrate at least one upper chip and at least one lower chip formed on the upper and/or lower surface of the substrate. The upper chip may be stacked over one lower chip or multiple lower chips. There may also be more than one upper chip stacked over one or more lower chips, or any combination of stacked upper chips and lower chips on the upper and/or lower surfaces of the substrate.

In accordance with exemplary embodiments, the multi-chip package (e.g., when the large-sized upper chip may be stacked over the reduced-sized lower chip), the upper chip need not have a hang-over portion.

In accordance with the above exemplary embodiments, a cavity or a groove may be formed on the upper chip by a selective etching process so that the upper chip may be stacked on the lower chip without a separate spacer.

In accordance with exemplary embodiments, the lower chip may be isolated from noise generated in the upper chip due to the formed cavity or groove.

In accordance with exemplary embodiments, in a case where a plurality of lower chips may be formed, interference between the plurality of lower chips may be reduced or prevented.

As described in exemplary embodiments, the term "cavity" or "groove" in the present invention may refer to a three-dimensional spaced formed on the chip. However, it should be appreciated that cavity or groove may relate to a hole, an opening, a gap, a recess, a hollow space, a void or a crater formed on the chip.

Although the exemplary embodiments of the present invention have been described in detail above, the invention is not limited to these particular embodiments and it will be apparent to those skilled in the art that many variations can be made without departing from the scope of the present invention.

What is claimed is:

1. A multi-chip package, comprising:
    a substrate including a plurality of substrate bonding pads formed on an upper surface and a lower surface thereof;
    at least one first semiconductor chip mounted on the upper surface of the substrate;
    at least one second semiconductor chip mounted on the lower surface of the substrate;
    at least one third semiconductor chip mounted on the upper surface of the substrate, the at least one third semiconductor chip having a non-active surface having a cavity, a groove or combination thereof thereof enclosing the at least one first semiconductor chip; and
    at least one fourth semiconductor chip mounted on the lower surface of the substrate, the at least one fourth semiconductor chip having a non-active surface having a cavity, a groove or combination thereof thereof enclosing the at least one second semiconductor chip.

2. The multi-chip package of claim 1, wherein the at least one first, second, third and fourth semiconductor chips are connected to the substrate bonding pads by at least one of a wire-bond and a flip-chip bond.

3. The multi-chip package of claim 1, wherein the at least one second and at least one fourth semiconductor chips, mounting portions and bonding portions of the mounting portions are encapsulated.

4. The multi-chip package of claim 1, wherein the at least one first and at least one third semiconductor chips, mounting portions and bonding portions of the mounting portions are encapsulated.

5. The multi-chip package of claim 1, wherein the substrate is at least one of a molded lead frame, a printed circuit board, a direct bond copper (DBC), a flexible film, and an interposer.

6. The multi-chip package of claim 1, wherein the at least one first semiconductor chip and the at least one second semiconductor chip are radio frequency (RF) chips, and the at least one third semiconductor chip and the at least one fourth semiconductor chip are chips for a memory or a logic circuit.

* * * * *